United States Patent [19]
Chappell et al.

[11] Patent Number: 5,973,529
[45] Date of Patent: Oct. 26, 1999

[54] PULSE-TO-STATIC CONVERSION LATCH WITH A SELF-TIMED CONTROL CIRCUIT

[75] Inventors: Terry Ivan Chappell, Portland, Oreg.; Walter Harvey Henkels, Putnam Valley, N.Y.; Wei Hwang, Armonk, N.Y.; Rajiv Vasant Joshi, Yorktown Heights, N.Y.

[73] Assignee: International Business Machines Corporation, Armonk, N.Y.

[21] Appl. No.: 08/778,854

[22] Filed: Jan. 6, 1997

[51] Int. Cl.⁶ ...................................................... H03K 3/289
[52] U.S. Cl. ............................ 327/200; 327/202; 327/203
[58] Field of Search ..................................... 327/199, 200, 327/201, 202, 203, 208–215; 326/93, 95–98; 371/22.3, 22.5

[56] References Cited

U.S. PATENT DOCUMENTS

| | | | |
|---|---|---|---|
| 5,012,246 | 4/1991 | Chung et al. ............................ | 341/160 |
| 5,459,421 | 10/1995 | Shaw ........................................ | 327/203 |
| 5,619,157 | 4/1997 | Kumata et al. .......................... | 327/203 |
| 5,712,826 | 1/1998 | Wong et al. ............................. | 365/226 |

*Primary Examiner*—Tuan T. Lam
*Attorney, Agent, or Firm*—F. Chau & Associates, LLP

[57] ABSTRACT

A low-power pulse-to-static conversion latch circuit is disclosed. The circuit includes self-timed control and an n-bit latch array both designed utilizing self-resetting CMOS circuit techniques. The self-timed feature of the control requires only one system clock input. The evaluation, reset and write-enable controls are all generated within a control macro. The latch is level sensitive scan design (LSSD) compatible and complies with self-resetting CMOS (SCRMOS) test modes. Use of these latches facilitates the synchronization, pipelined operation, power-management, and testing of advanced digital systems employing a mix of static and dynamic circuits to achieve high performance.

16 Claims, 15 Drawing Sheets

FIG. 9 Waveforms occuring in the latch bit cell during normal writing and reading.

PULSE-TO-STATIC CONVERSION LATCH WITH A SELF-TIMED CONTROL CIRCUIT

BACKGROUND OF THE INVENTION

1. Field of the Invention

The present invention generally relates to digital integrated circuits and, more particularly, to sequential logic circuits and systems such as digital clock generators and latch arrays used in the datapaths and control paths of microprocessors, and other electronic digital systems. More specifically the invention relates to a pulse-to-static conversion with a self-timed control circuit latch for systems designed with dynamic circuits, and to the interfacing of dynamic and static circuits.

2. Description of the Prior Art

It is usual to classify digital switching networks into two categories: combinatorial and sequential. Combinatorial switching networks are those whose outputs only depend on the present inputs. Sequential switching networks are those whose outputs depend on the past sequence of inputs as well as on the present inputs. Such circuits store information about the previous history of the inputs in storage elements called latches and/or registers. The information stored in latches and registers can be updated (a new state replacing a present state) in a controlled and predictable manner by triggering from a periodic global clock signal distributed throughout the digital system. The global clock ensures that all memory elements change state at approximately the same time. Systems which are synchronized to a global clock are called synchronous. Conversely, asynchronous systems have no global clock distribution, but instead require self-timed circuit techniques.

Synchronous systems require synchronization of the setting of latches to the global clock. Referring to FIG. 1, a conventional prior-art level sensitive D-latch is shown. The output of the latch follows its data-input for all the time that the clock maintains a given level. In CMOS this latch is constructed from two transmission gates and two CMOS inverters. The inputs are a data input, D1, and a clock and its complement, CLK and CLKN, respectively. The outputs are Q1 and its complement Q1N.

Referring to FIG. 1, when the clock is high, "H", Q1 obtains the value of D1 and the feedback path from the output of inverter I1 to the input of inverter I2 is broken (open). Conversely, when CLK="L" the feedback path is established and the input D1 is disconnected. Hence the output depends upon the level of the clock signal; as long as CLK="H", Q1 samples D1 continuously. The latch in FIG. 1 is positive level sensitive. By reversing the control signal connections to the transmission gates, a negative level sensitive latch can be formed.

Master-slave and edge-triggered registers are known to have improved reliability. A positive-edge-triggered D register, formed by combining a negative level-sensitive latch with a positive level-sensitive latch is shown in FIG. 2. The first stage latch is the "master", the second the "slave". In edge-triggered registers the data input is sampled only during a transition (edge) of the clock. As shown in the waveforms, in the example of FIG. 2, the output Q takes on the value of the input D only at the times of the positive (low-to-high) transitions of the clock, CLK.

Combinatorial logic can be formed from a wide diversity of circuit techniques. These techniques can be broadly divided into two categories: static and dynamic. Most often, if the performance constraints allow, static logic is used wherever possible, for expediency, simplicity and reliability. Static CMOS circuit nodes undergo at most a single transition during the course of a logic cycle (system clock period). However, with increasing pressure for ever higher performance, digital designs are increasingly employing dynamic circuit techniques in critical paths, both in datapaths and control paths. Dynamic circuits are characterized by circuit nodes which are typically discharged as quickly as possible at the time of logic evaluation, and then later in the cycle these nodes are pre-charged, i.e. reset, back to their initial, standby values. That is, if in a logic cycle a dynamic node is discharged, then later in that same cycle the node is re-charged back to its initial state. There are two transitions within the cycle, in contrast to one transition for a static node. Thus the waveforms on dynamic nodes are pulses of duration less than the cycle time.

FIG. 3 shows a comparison of the waveforms on the dynamic and static circuit nodes for similar bit-patterns. For example, DYN1 shows a dynamic node and ST1 a static node for a 1-1-1-0 bit pattern. For the dynamic node a "1" is represented by the presence of a unipolar pulse, whereas a "0" is represented by the absence of a pulse, during a clock period. In contrast, for the static node a "1" is represented by a high voltage level and a "0" by a low voltage level. Notice that a complete pulse is generated during each cycle for an active ("1") dynamic node, whereas for a static node at most a single transition occurs during a cycle, and in cases of consecutive same-bits the static level does not change. The bottom two waveforms show a dynamic node, DYN2, and a static node, ST2, for a different bit pattern, 1-0-1-0.

The implication for registers in a synchronous design are that if the inputs to the registers are dynamic then the registers must "capture" pulses, whereas if the inputs are static the register need only detect a level, at for example, the time of one of the clock edges. For the arbitrary dynamic pulses shown in FIG. 3, neither the level-sensitive D-latch of FIG. 1, nor the edge-triggered register of FIG. 2 would detect the dynamic "1" state. The fact is that prior-art latches and registers similar to FIGS. 1 and 2 are in general inadequate for capturing and storing the information content from dynamic inputs.

For the purpose of reviewing the merits of dynamic and static circuits, an example comparison of 3-input AND gates is shown in FIG. 4, for three different styles of logic. FIG. 4(a) shows the conventional static CMOS circuit. Two styles of dynamic circuits are shown in FIGS. 4(b) and 4(c). FIG. 4(b) is the corresponding domino-logic circuit and FIG. 4(c) is the corresponding self-resetting case.

The domino-logic circuit operation is tightly synchronized to the system clock. When the clock is low, the pre-charge device is held on and this pre-charges the dynamic node high. This is the standby mode. When the clock is active high, the pre-charge device is off and the tree of NMOS devices is enabled. The domino inputs must be valid during the clock-active period. In this example, if all inputs, IN1, IN2 and IN3 are active when the clock is high, the dynamic node will be discharged and the output will rise to "H". Then when the clock goes low again the pre-charge device turns on and resets the dynamic node to its standby-high state, and subsequently the output resets to "L".

The self-resetting case differs most significantly from the domino-case in that resetting of the dynamic node is totally independent of any system clock. Rather, the reset is derived locally either by feedback from downstream logic, or from a local timing chain triggered by an input upstream. That is, the circuit is self-resetting, or self-timed. During standby the RESET signal is high, "H". Therefore, to prevent the dynamic node (labelled "quasi-dynamic node" in FIG. 4(c)) from gradually discharging due to leakage during this standby period a small standby device, QS, is held on by feedback from the output (the output inverter and QS from a "half-latch").

In FIG. 4 the numbers next to the devices are relative device widths. The sum of all device widths gives an approximate size comparison among the three circuits. Summing the widths it can be seen that the static circuit is about 50% larger than either dynamic circuit. The generalization is true that dynamic circuits occupy less area, primarily due to the fact that there are fewer PMOS devices. Furthermore, the dynamic circuits are generally faster than static circuits, because there are fewer PMOS devices loading the dynamic outputs. The outputs of FIG. 4 go to inputs similar to the inputs of the FIG. 4 circuits. Less gate capacitance loading, again due to fewer PMOS load devices, also leads to lower power dissipation for the dynamic circuits. In short, dynamic circuits are faster and smaller than static circuits, and for a given cycle time dissipate less power.

However, static circuits have a significant advantage in ease of design. Static circuits avoid the pre-charging and clock distribution that are necessary for domino-logic, and avoid the resetting necessary in the self-resetting CMOS case. Furthermore, the noise margins for static circuits are larger than for dynamic.

Comparing the dynamic circuit cases, SRCMOS has the potential advantages over domino-logic of higher performance because of the absence of any clocking devices in the logic trees, and greatly reduces the loading on any system clock, thereby alleviating clock skew and power problems. However, SRCMOS is more difficult to design at the system level because of the lack of the global synchronization provided by a global clock.

Hence, it is seen that there are various pros and cons among the variety of static and dynamic circuit techniques. Consequently for high-performance designs it is advantageous to choose a mix of static and dynamic circuits, utilizing dynamic circuits where performance, area and power are a premium, and using static elsewhere. Thus, in order to reap the benefits of mixing logic circuit types in combinatorial logic, there is a need for fast pulse-to-static converters and pulse-to-static conversion latches in order to interface dynamic circuits with static circuits.

A further need for pulse-to-static conversion latches occurs in the case of driving long lines wherein load capacitances are dominated by line-capacitance, rather than gate capacitance. Such cases occur for example when one logic sub-system has to interface to another sub-system some non-negligible distance across the chip. In these cases less power will be dissipated if the long lines carry static signals rather than dynamic. The reason for this is as follows: Power dissipation in the long line occurs only when the line is charged up to the high voltage level, "H". Referring back to FIG. 3, it is evident that such charging takes place in dynamic lines whenever there is a 0-to-1 or 1-to-1 transition. In these situations a complete pulse is created, which first charges, and then discharges the line capacitance. However, in the case of static signals, charging of the line capacitance only occurs for a 0-to-1 transition, which can only occur at most once every two cycles. Thus for worst-case patterns, 1-1-1-1 . . . for dynamic, and 0-10-1 . . . for static, the static case will dissipate only half as much power as the dynamic case. That is, the "switching factor" for static circuits is at most one-half the dynamic-value, and in most practical cases the ratio is even smaller.

A concern in modern VLSI circuits, which can contain millions of transistors, is designing-for-test. This concept considers how a design can be effectively tested, right from the inception of the design, and specifically how to include appropriate test facilities.

One common technique is to make the register comply with the Level Sensitive Scan Design (LSSD) methodology. In the LSSD methodology, registers are constructed in a way such that they can be converted to shift-registers which can be serially interconnected. In the LSSD test mode test data can be shifted into the registers before performing a normal logic cycle, and then the results can be subsequently shifted out and compared with expected results.

An alternative test methodology specifically for self-resetting CMOS circuits is the "static-evaluate" mode. In the static-evaluate-mode, the dynamic circuits are converted to ratioed, pseudo-nmos circuits which reset automatically, at a slow rate, when the circuit inputs are reset. This enables slow-speed testing of functionality.

SUMMARY OF THE INVENTION

It is therefore an object of the present invention to provide circuit techniques for interfacing dynamic and static circuits via a latch.

It is another object of the invention to provide self-timed clock generators for controlling the evaluation, resetting, and write-enable functions of the latch.

It is a further object that the self-timed clock generators have only a single active control input in normal operation. This input is the system clock.

It is a further object to provide a dynamic-to-static conversion latch that has a pulse-catching input and a static output.

It is a further object that the latch be relatively simple in design and provide fast and effective pulse-to-static conversion of digital signals.

It is a further object to employ dynamic circuit techniques to achieve a pulse-to-static latch having high speed, low power, and a small area.

It is a further object that the circuitry be fully compatible with the Level Sensitive Scan Design (LSSD) test-methodology and be compatible with the self-resetting CMOS test-methodology.

According to the invention, the problems encountered in conventional mixed dynamic/static approaches are addressed by implementing the pulse-to-static conversion latch-array consisting of an n-bit latch-array and a self-timed control macro, which utilizes self-resetting CMOS circuit techniques. With the self-timed concept, the control macro requires only one control-input, the system clock. The evaluation, resetting and write-enable signals are all generated internally, within the contro macro. The design is fully compatible with the LSSD test methodology, and with self-resetting CMOS diagnostic modes.

By employing self-resetting CMOS circuit techniques, the pulse-to-static conversion latch array of the present invention provides high performance, low power, pulse-to-static conversion, thereby enabling fast-cycle-time, minimum-delay-time and low-latency designs. Thus the latches make possible synchronization, pipelined operations and LSSD-testing in advanced high clock rate digital systems.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT

Figure 1:
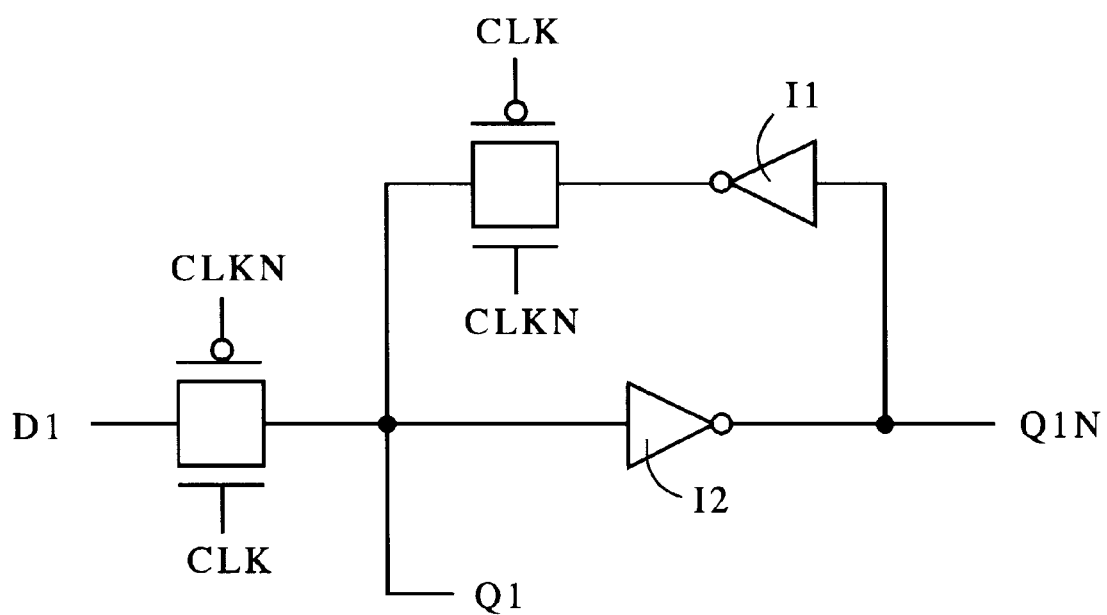
FIG. 1 is a CMOS positive-level-sensitive D-latch.
Figure 2:
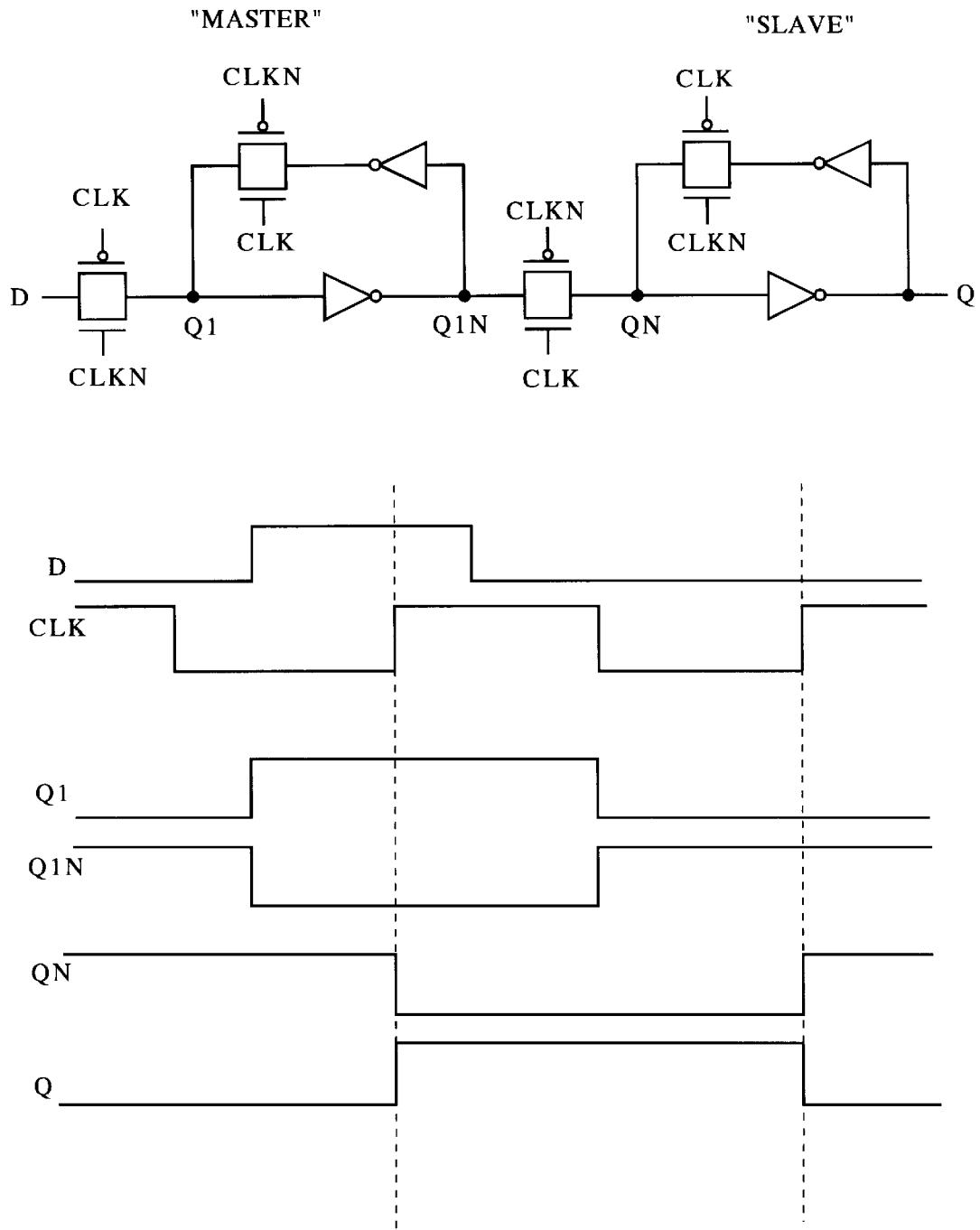
FIG. 2 is a CMOS positive-edge-triggered D-register and associated waveforms.
Figure 3:
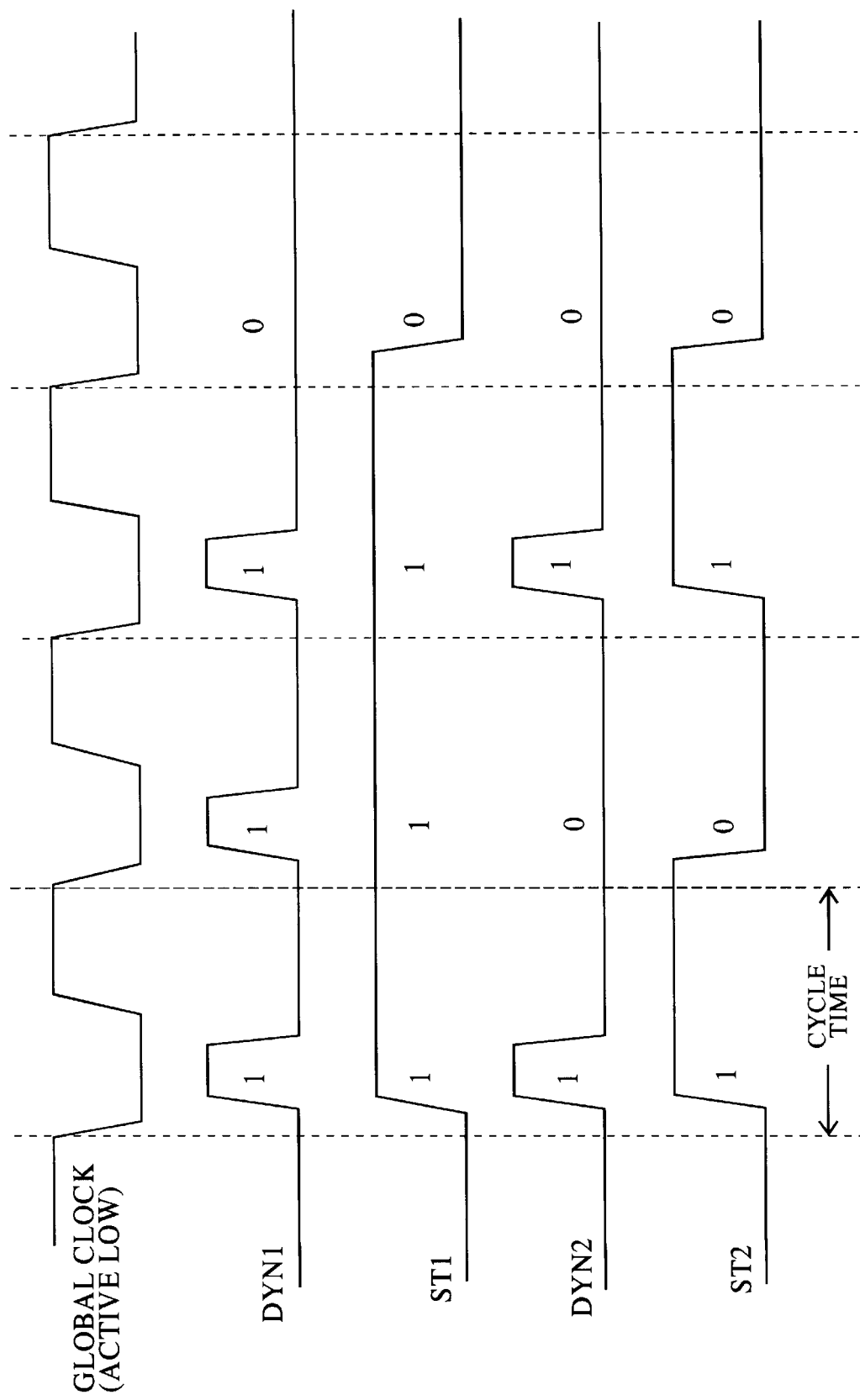
FIG. 3 shows a comparison of dynamic-node and static-node waveforms over four cycles for two bit-patterns.
Figure 4A:
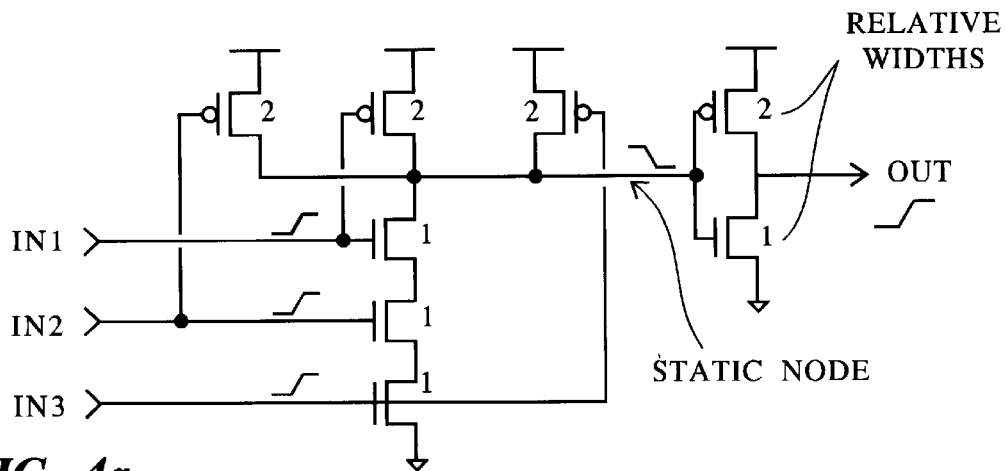
FIG. 4 shows 3-input AND gates corresponding to three types of circuit design: (a) static CMOS; (b) dynamic domino CMOS; and (c) self-resisting CMOS (SRCMOS).
Figure 4B:
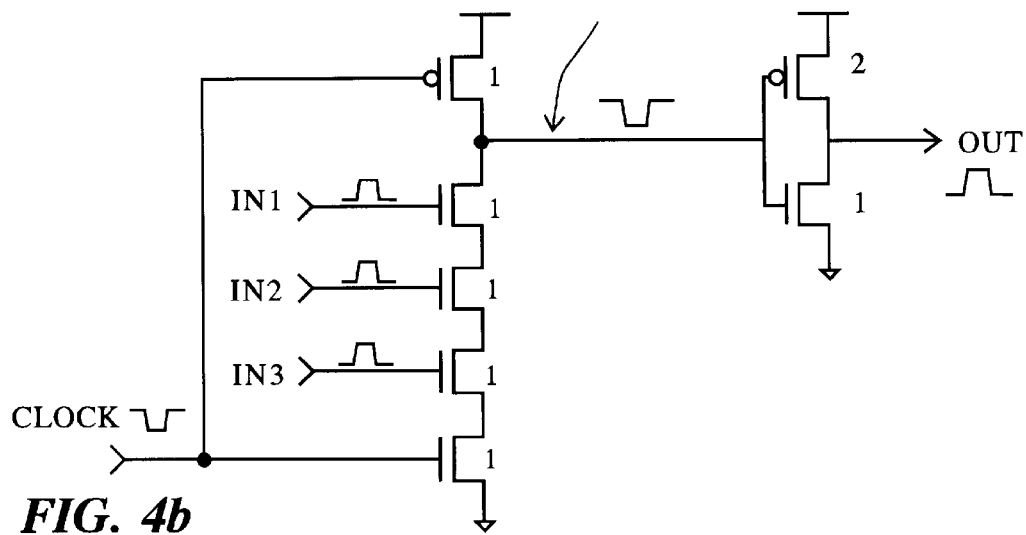
Figure 4C:
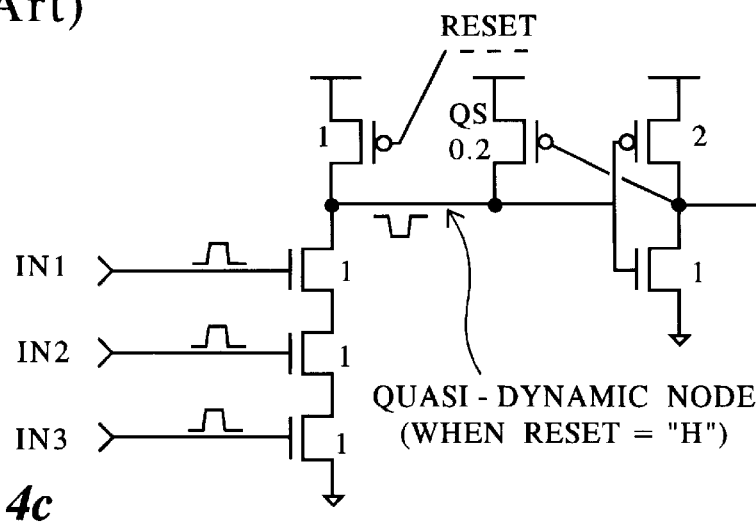
Figure 5:
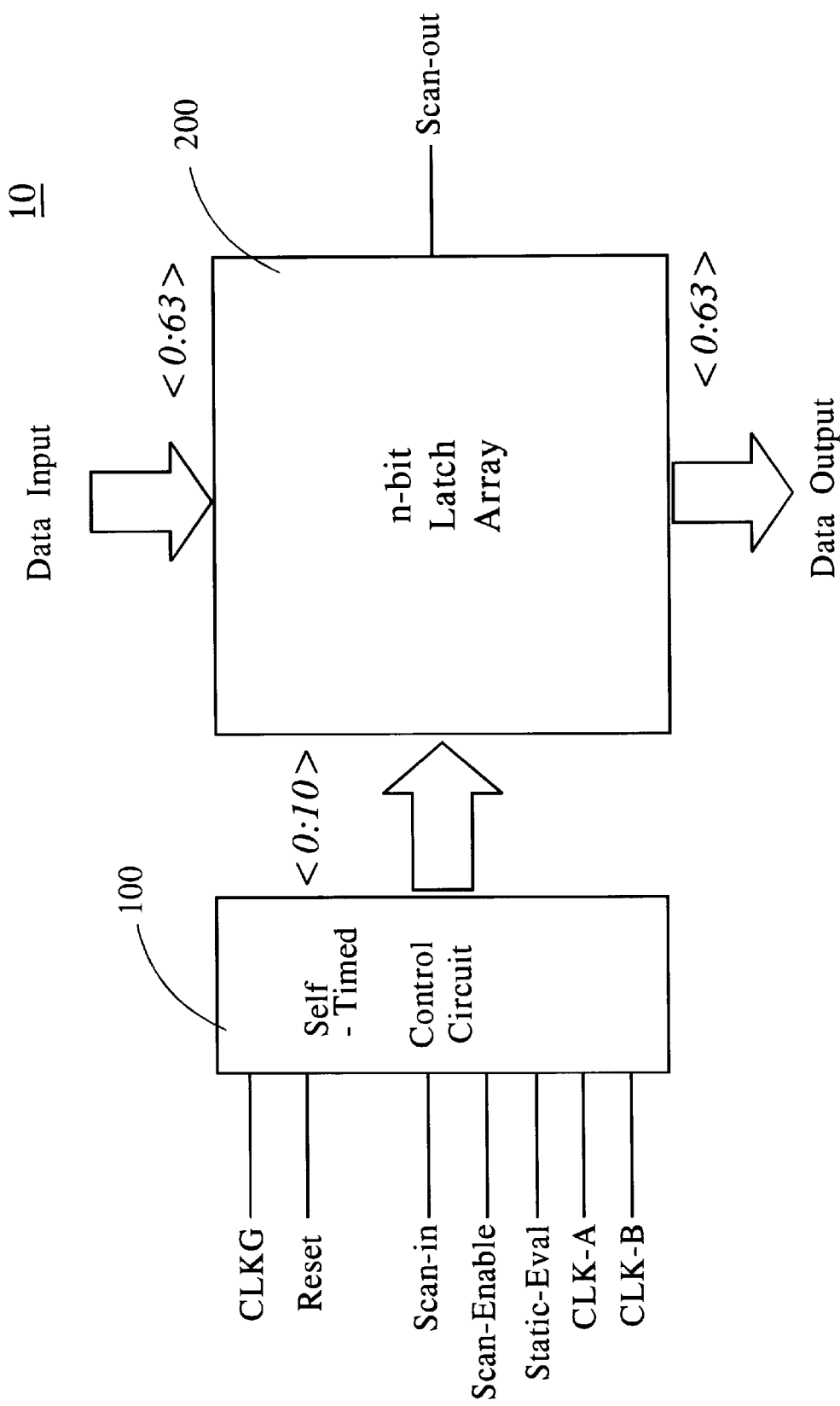
FIG. 5 is a block diagram of the invention, consisting of a self-resetting CMOS pulse-to-static conversion latch array and a self-timed control circuit.

A self-resetting CMOS pulse-to-static conversion latch array system of the present invention is shown by FIG. 5 and designated generally as 10. The latch array system 10 includes a self-timed control circuit block 100 and a latch array 200. The control block 100 receives seven inputs, a global clock signal, CLKG; four LSSD-test-related signals, Scan_in, Scan_Enable, CLK_A and CKL_B; and two SRCMOS test-mode signals, RESET and Static_Evaluate. Only CLKG is active during normal operation of the latch array system 10, i.e., during write and read operations. The control block 100 generates eleven outputs which serve as control signals for the latch array 200. The latch array system 10 utilizes self-resetting CMOS (SRCMOS) circuit techniques in which the reset signals are derived locally. The system circuits can therefore hide the resetting within the machine cycle, while still using a single phase, edge-triggering, global clock design. Furthermore, the current associated with the resetting gets distributed over the global clock cycle, which reduces di/dt noise on the chip. The circuits, which are described in more detail below, allow a high degree of flexibility in the design of pulse zones and allowed data-input arrival times.

Figure 6:
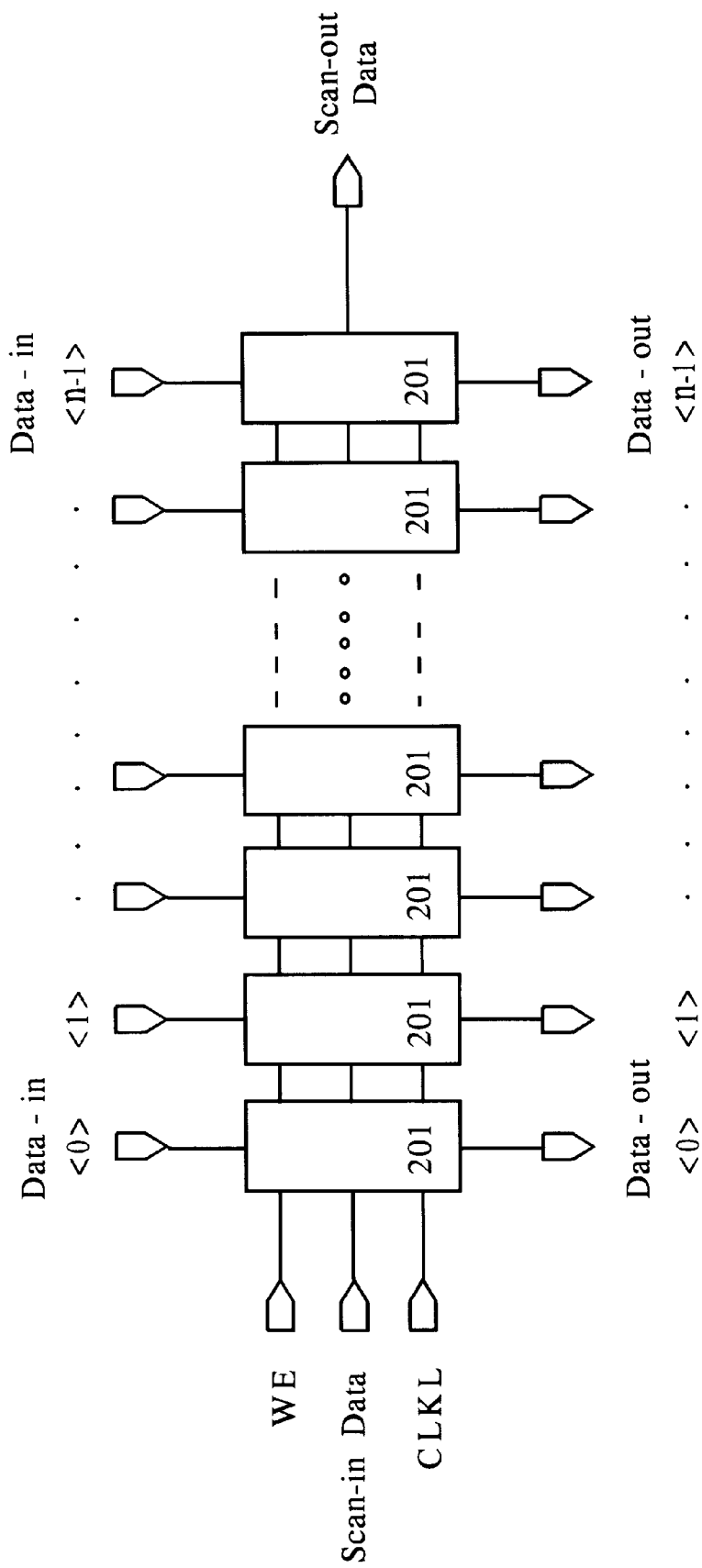
FIG. 6 is a schematic diagram illustrating the implementation of the pulse to static latch array as a combination of individual latch bit cells according to the present invention.

The pulse-to-static conversion latch array 200 comprises n-latch-bit cells and each latch-bit cell 201 has one bit-pitch of fixed width and height. Herein, as an example, n=64. Therefore, in a normal operating cycle the latch receives 64-bits of input data, and delivers 64-bits of output data. At the extreme right in FIG. 5 is the scan chain output, Scan_out. In LSSD-mode this output delivers a one-bit serial string of scan-out test data. The n-bit latch array block 200 is further detailed in FIG. 6, showing n individual latch-bit cells 201 arranged in parallel with respect to the data inputs and outputs, and arranged in series with respect to the Scan_in and Scan_out data. The only control inputs shown in FIG. 6 are the write enable, WE, which transfers data from the input stages, and the local clock, CLKL, which is generated from the global system clock, CLKG. The local clock, CLKL, causes transfer of the data to the output stages.

Figure 7:
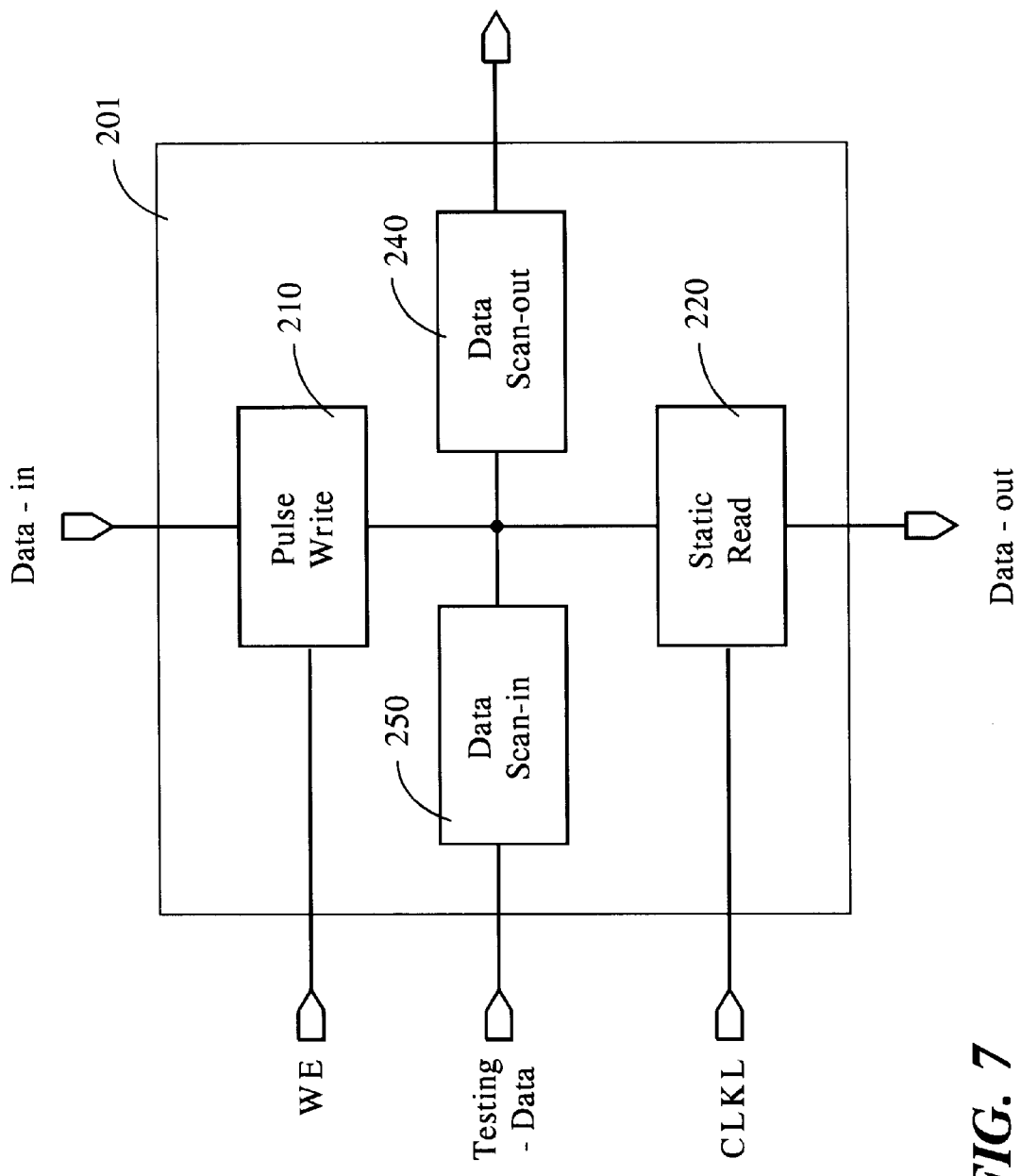
FIG. 7 is a block diagram of the self-resetting CMOS pulse-to-static conversion latch bit cells according to the present invention.

FIG. 7 is a block diagram of a latch bit cell 201, which is usable as an interface to a register file to facilitate operation of the register file with either a dynamic or static dataflow. The register file may be one such as disclosed and described in the commonly assigned U.S. Pat. No. 5,481,495. For example, the latch bit cell 201 provides the static input data required by the register file, whenever the register file is situated in a totally dynamic dataflow path. The cell 201 can also be placed at the register file output to convert the dynamic output to a static signal. According to tests conducted with a latch bit cell in the configuration as shown as cell 201 in FIG. 7 when attached to one of the output ports of a register file, cell 201 captures 1.2 ns output pulses of the register file and converts them to static levels.

The cell 201 consists of four sub-blocks: an input-data pulse write sub-block 210, an output data static read sub-block 220, and data scan-in and data scan-out sub-blocks for LSSD testing 250 and 240, respectively. The data-write sub-block 210 which is controlled by the write-enable signal WE, is located in the upper part of the cell. The data-read sub-block 220, which is controlled by CLKL signal, is located in the lower part of the cell. The normal data path is from the upper sub-block 210 to the lower sub-block 220. The scan data-in sub-block 250 and the scan data-out sub-block 240 are located at the left and right sides of the cell 201, respectively.

Figure 8:
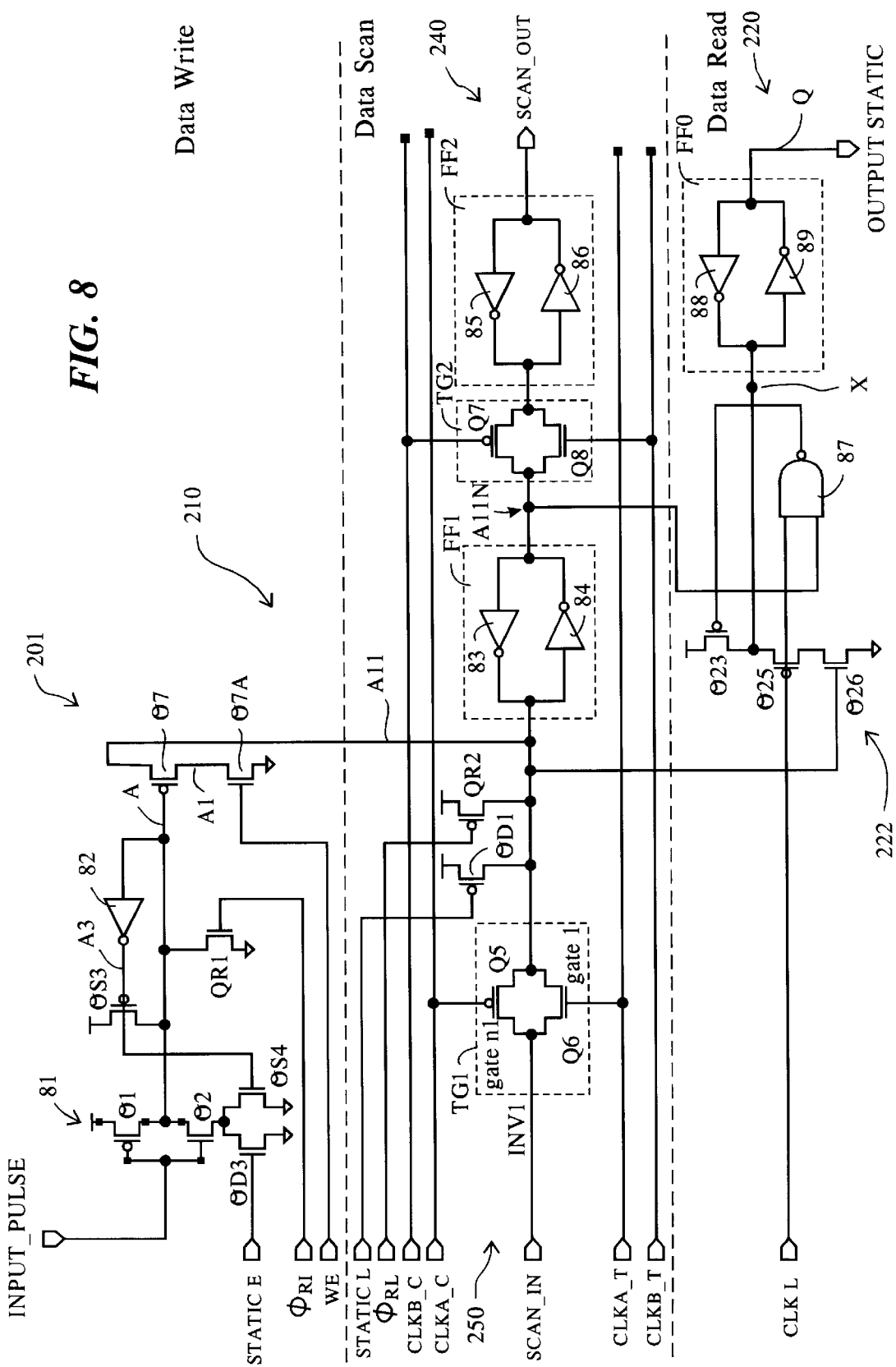
FIG. 8 is a schematic diagram of a preferred embodiment of the circuitry of the pulse-to-static conversion latch bit cell of the present invention.

With reference to FIG. 8, a circuit schematic of a preferred embodiment of the latch bit cell 201 is shown. As mentioned above, the latch bit cell 201 consists of data-write 210, data scan-in 250, data scan-out 240, and data-read sub-blocks 220, which are partitioned by the dashed lines in FIG. 8. The temporary storage latch FF1, formed by the cross-coupled inverters 83 and 84 is shared by all three stages. The latch bit cell 201 employs a mix of dynamic and static circuits. The data input stage is dynamic and the data output stage is static. The dynamic controls, which are active during normal operation, are the write-enable WE, the local clock CLKL, and the local reset clocks φRI which resets the input-node A, and φRL which resets the latch-node A11. In normal operation the dynamic input data pulse gets captured in the data-write stage, then gets transferred to the temporary storage latch FF1 if or when the write-enable WE goes active (high). This data then gets transferred to the output latch FF0, consisting of the cross-coupled inverters 88 and 89, when the local clock pulse CLKL arrives. In this normal mode of operation the input-node A, and the latch-node A11, are dynamic nodes in the sense that if, within a cycle they are set, then they must be reset within that same cycle. This resetting is accomplished by dynamic pulses on the reset clocks φRI and φRL. The node labelled X is part of the output circuit. It is a static node, which gets set by the temporary storage latch FF1 when CLKL is active (high), but is totally disconnected from FF1 when CLKL is in its standby-state (low). The data path, from capture of the data-input pulse, to the temporary storage latch FF1, to the output latch FFO, to the data-output is optimized for speed. The nominal delay of the latch can be very fast. For long output lines the output power dissipation is minimized due to the use of static data outputs. The other input controls in FIG. 8 are only active during testing. The LSSD-related controls are the test-data scan I/O, SCAN_IN and SCAN_OUT, and dual-rail versions of the scan clocks, CLKB_C, CLKA_C, CLKA_T and CLKB_T, where the T(C) refers to the "true" (complement) rail. The STATICE and STATICL controls are used to implement the self-resetting CMOS static-evaluate diagnostic mode. The three sub-blocks or stages, namely, data-write, data-read, and data-scan, are described in more detail below.

The data write stage 210 receives the input pulse (e.g. using the high to low transition) from the ground-interrupted inverter 81. The nMOS device of inverter 81, Q2, is connected to two parallel nMOS transistors, QD3 and QS4. The sources of QD3 and QS4 are connected to ground. The combination of inverter 82 and weak inverter pair, QS3 and QS4, form a full latch circuit which will capture and hold data on the input-node A, which is active high, "H", in this embodiment. The gate of Q7 is connected to node A, and the gate of Q7A is connected to the write-enable signal, WE. When both node A and WE are high the latch-node A11 will be pulled down (active low) and will set the temporary storage latch FF1. QR1 is a reset device which resets the input-node A. QR1 is controlled by the reset-input clock, SR1, which is generated in the control block 100, and discussed more below. When φRI goes high (active high pulse) QR1 turns on and resets node A, so that new input data can be received. Likewise, QR2 is a reset device which resets the latch-node A11. QR2 is controlled by the reset-latch clock, φRL, which is also generated in the control block 100. When φRL is active (active-low, "L" pulse) QR2 turns on and resets node A11 back to its standby-state (high).

The data scan-in and data scan-out stages 250 and 240 consist of two transmission gates, TG1 and TG2, and two latches, FF1 and FF2. FF1 and FF2 serve the role of the so-called L1 and L2 master/slave latches in the LSSD methodology. The input of the first transmission gate TG1 is connected to the scan-in data. The output of TG1 is connected to node A11. The gate of NMOS device Q6 is connected to the true-rail of scan-clock-A, CLKA_T, and the gate of pMOS device Q5 is connected to the complement, CLKA_C. The master latch FF1 will hold either input data or testing scan-in data at nodes A11 and A11N. The input of the second transmission gate TG2 is node A11N and the output of TG2 drives the latch FF2. The gate of nMOS device Q8 is connected to the true-rail of scan-clock-B, CLKB_T, and the gate of pMOS device Q7 is connected to the complement, CLKB_C. The slave latch FF2 will scan out data to the next latch-bit cell from the output node scan-out.

The devices QD3 and QD1 in the data write 210 and data scan 240 stages, respectively, are only active (on) in the SRCMOS static-evaluate test-mode. These devices, controlled respectively by STATICE, and its complement, STATICL, force automatic resetting of the input-node A and the latch-node A11, respectively, when the data-input returns to its standby-state. Consequently, this mode allows functional testing of the latch bit cell 201 with an input pulse of much wider duration than is encountered in normal high-speed operation.

The data read stage 220 consists of a steering gate 222, a feedback half-latch NAND gate and the output latch FFO. The steering gate 222 is comprised of two pull-down NMOS devices in series, Q25 and Q26, and a pull-up pMOS device, Q23. The static node X is connected to the drain junctions of Q25 and Q23 and also the input of FFO. The gate of Q26 is connected to the dynamic latch-node A11. The gate of Q25 is connected to the local clock, CLKL, which is generated in the self-resetting control block 100. The inputs to the half-latch NAND gate 87, are the dynamic node A11N and CLKL. The output of the NAND gate 87 is fed back to control the gate of Q23. If A11N is high when the CLKL active-high pulse arrives, then the output of the NAND gate 87 will go low, which will turn on the pMOS device Q23. At this moment, the static node X will be pulled-up to the high-state. Then, when CLKL goes low, the output of NAND gate 87 goes high thereby turning off Q23, and simultaneously Q25 turns off. Thus node X retains its state, held by the inverter 88 of FFO. As a result a pulse input in converted to a static output, which is held by the output latch FFO. In this example the output Q is forced and held low, "L". In the other possible case, wherein the dynamic data input is "0", there is no input pulse and the latch-node A11 remains high, device Q26 is on, and node A11N is low, and the output of NAND 87 is high and thus Q23 is off. Then when the active-high CLKL pulse arrives, nMOS device Q25 turns-on, node X is pulled down to the low-state, and the output Q is switched to the high-state, if it had previously been low.

Figure 9:
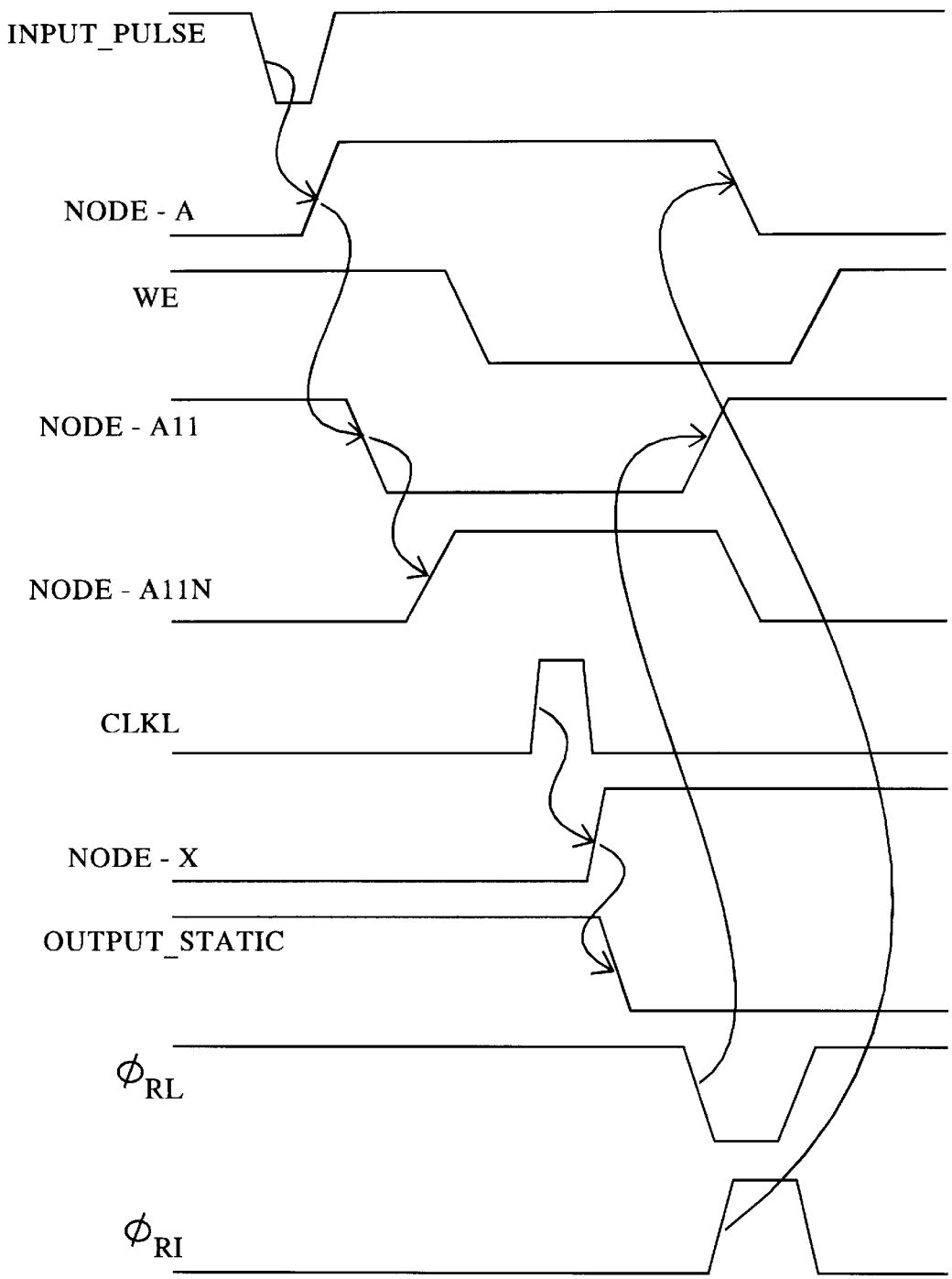
FIG. 9 illustrates waveforms associated with the latch bit cell of FIG. 8 during normal writing and reading operations.
Figure 10:
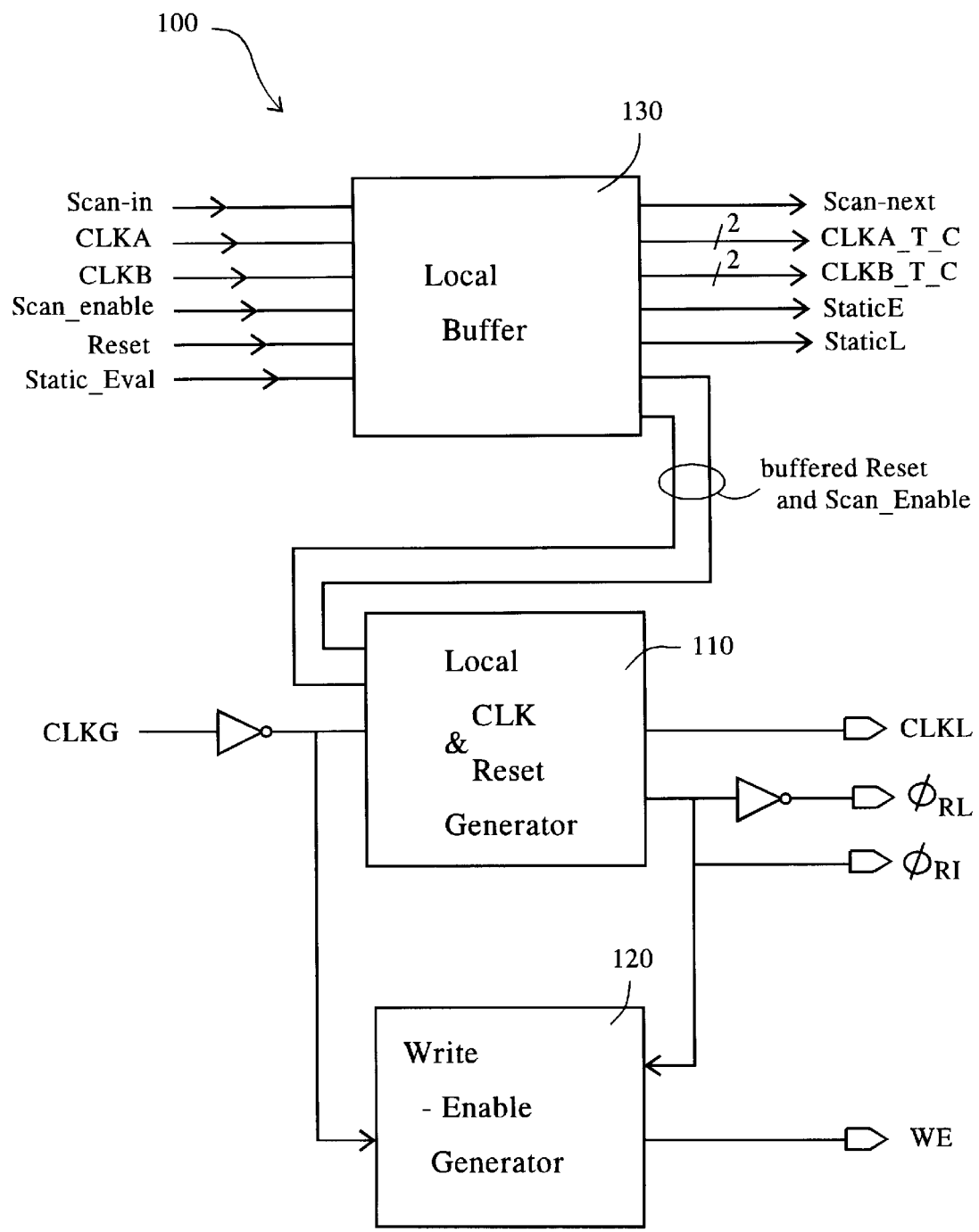
FIG. 10 is a block diagram of the control circuitry, which generates the control signals for the latch array of the present invention.

FIG. 9 illustrates waveforms corresponding to the nodes and signals of FIG. 10 during a normal data-write, data-read operation, in response to a pulse (active-low) on the data input. The arrows indicate the triggered responses that are described above. For proper read and write operations, it is necessary that the write-enable signal WE, which is generated by the control block 100, be timed such that it goes low during the read operation, while CLKL is active and during resetting of the dynamic nodes A, A11 and A11N.

Referring to FIG. 10, the sub-components of the control block 100 are shown. These sub-components are a local buffer 130, a local clock and reset generator 110, and a write-enable generator 120. As mentioned above the control block 100 receives seven global input control signals. These are a global clock signal, CLKG, which is the only input active in normal operation and the only global input to the local clock and reset generator block 110, and six test-related global signals, which are inputs to the local buffer 130. The write-enable generator block 120 receives two inputs: one is CLKG, and the other is an output, φRI, of the reset generator block 110. Four of the test signals are used in LSSD testing: SCAN_ENABLE, SCAN_IN, CLKA and CLKB. Finally, two controls are used in the SRCMOS test—methodology: RESET and STATIC_EVALUATE. The local clock block 110 receives two local inputs, buffered versions of RESET and SCAN_ENABLE, from the local buffer block 130.

The global test signals are all low and off during normal operation and have no critical timing requirements. RESET must be on when power is first ramped-up in order to insure initialization of all SRCMOS circuits. RESET must also be on when measuring the IDD leakage current of the reset devices. STATIC_EVALUATE is used for SRCMOS diagnostic testing. SCAN_ENABLE disables φRL so that the level-sensitive scan design (LSSD) scan chain can be operated properly. The other LSSD-related signals have already been discussed above. The control block 100 of this invention generates the eleven control signals required by the latch cells 201. The only outputs active in normal operation are the four dynamic control signals, WE, generated by the write-enable sub-block 120, and CLKL, φRL and φRI, which are generated by the local clock and reset generator sub-block 110. The test-related outputs are all derived from the local buffer block 130. These are the five LSSD-related signals, Scan_next, CLKA_T, CLKA_C, CLKB_T and CLKB_C, and the static-evaluate-test-mode signals, STATICE and its complement STATICL.

The prime advantage of the self-timed control circuit described herein is that the macro design requires only a single input signal during normal operation, the global clock, CLKG. The local clock, self-resetting, and write-enable signals are all generated by the macro itself. The write-enable feature is obtained by adding signals from blanking and unblanking circuits, which insure that the input pulse is either blocked or unblocked from the latch-nodes.

Figure 11:
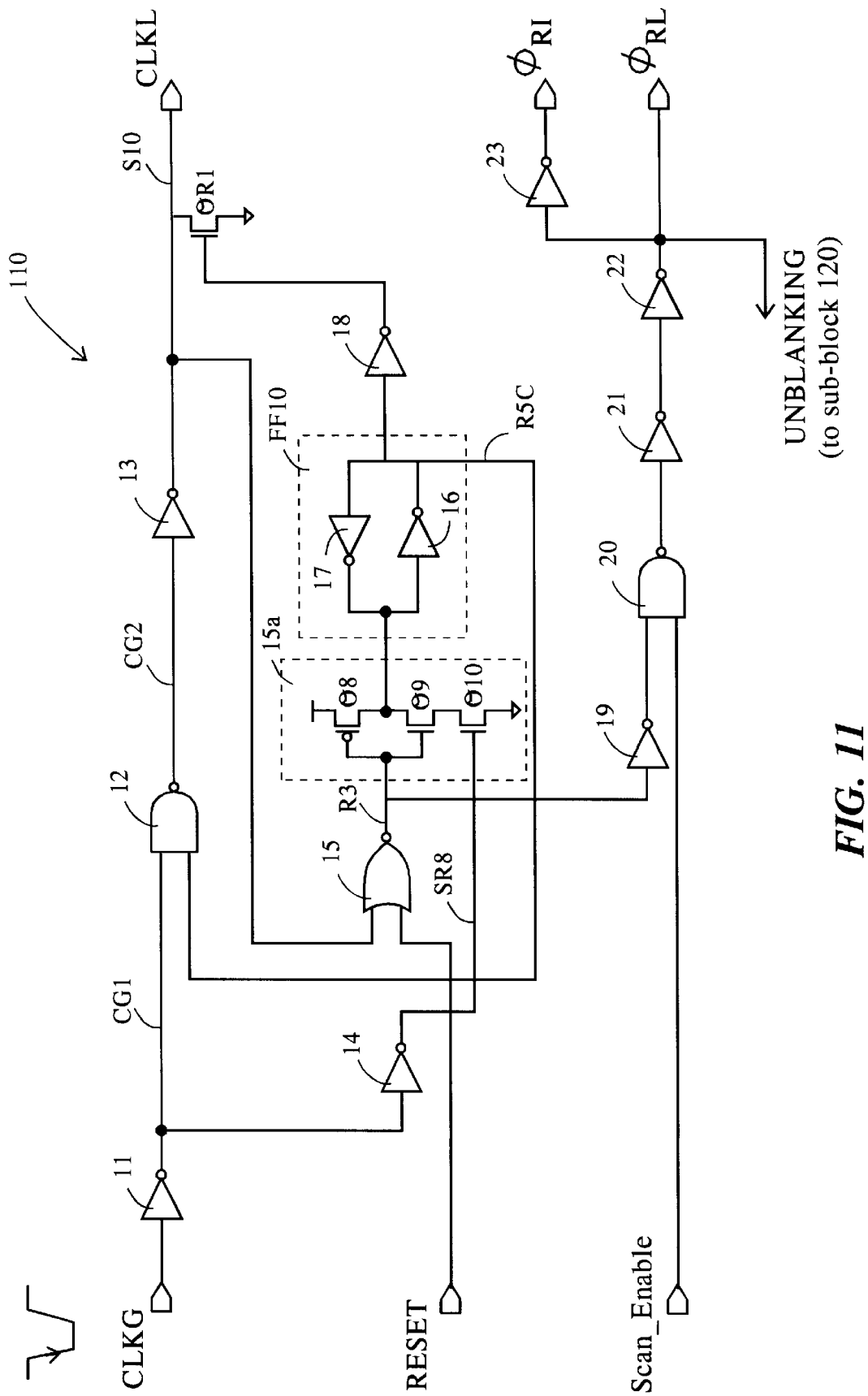
FIG. 11 is a schematic diagram of a preferred embodiment of the local-clock and reset-pulse generator of FIG. 10.

FIG. 11 is a schematic diagram of a preferred embodiment of the local clock and reset pulse generator 110. The local clock CLKL, the reset-latch pulse φRL, and the reset-input pulse φRI are all derived from the input global clock CLKG. The CLKL circuits consist of two paths. One path generates the positive-going leading-edge and the second path generates the falling-edge of the CLKL pulse. Hence the CLKL pulsewidth is determined by the difference of the delays between these two paths. The forward, leading-edge, path consists of input buffer/driver 11, which receives the CLKG signal, NAND gate 12, and an inverter/driver 13. The NAND 12 has two inputs: the output of inverter 11, node CG1, and a signal on node R5C of the reset, or falling-edge, path. The output of NAND 12, node CG2, is the input to inverter 13. When triggered by the falling-edge of CLKG the forward path produces a rising output of inverter 13, and this is the rising, leading-edge of CLKL. This reset path consists of the NOR gate 15, the ground-interrupted inverter, consisting of devices Q8, Q9 and Q10, the latch FF10 (the cross-coupled inverters 16 and 17), inverter 18 and reset-device QR1. The feedback reset path for CLKL is triggered from the output of the inverter/driver 13. This signal and the global RESET testing signal serve as the two inputs to NOR gate 15. The output of NOR gate 15, node R3, is connected to the ground-interrupted inverter 15a, which consists of one pMOS device, Q8, and two NMOS devices, Q9 and Q10. The gate of Q10 is connected to node SR8, which follows two stages of inverter delay of CLKG. These inverters are 11 and 14. The output of the ground-interrupted inverter 15a is connected to the latch FF10 which holds the signal. The output of FF10 goes through another inverter 18. When the output of inverter 18 rises, it turns on the NMOS reset device QR1, subsequently pulling down node S10, i.e. forming the falling-edge of CLKL. The CLKG signal serves to drive all the local-clock-controlled latch bit array cells. It should be noted that every global clock, CLKG, cycle generates one and only one positive CLKL pulse.

The φRL and φRI, reset pulses are triggered from node R3 of the feedback reset path for CLKL. This node, which is the output of NOR 15, serves as the input to inverter 19. The output of inverter 19 and the scan-enable input signal serves as the inputs to NAND gate 20. The output of NAND gate 20 is buffered by two inverters 21 and 22, before serving as the φRL output. This output also serves as the trigger input to the unblanking circuit of the write-enable sub-block 120. Also, the φRL pulse passes through one more inverter buffer 23 in order to generate the φRI pulse.

Figure 13:
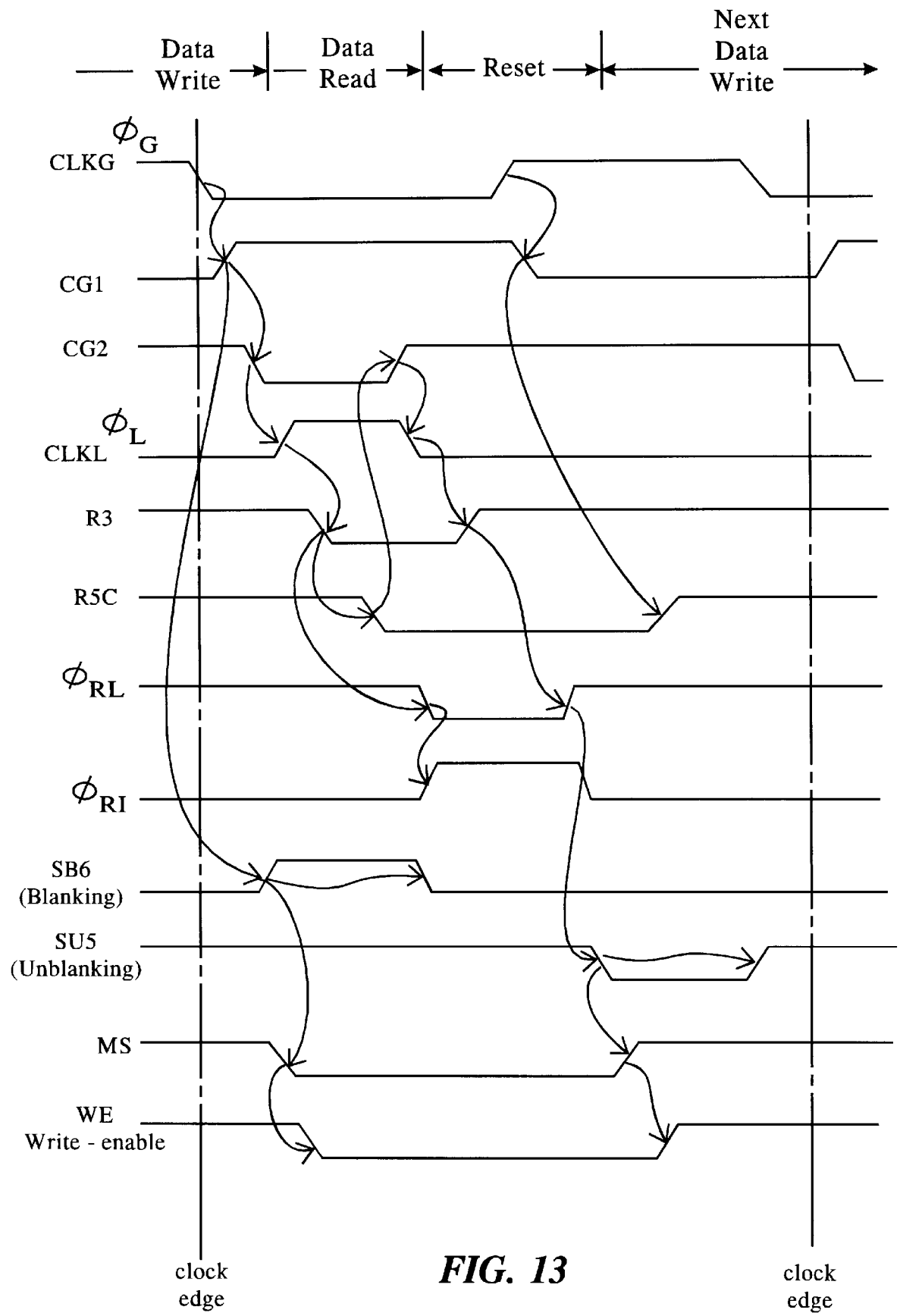
FIG. 13 is a timing diagram showing the waveforms of associated nodes in the clock-controlled circuits illustrated by FIGS. 10–12.

The sequence of waveforms CLKL, φRL, and φRI generated from CLKG, along with some intermediate nodes CG1, CG2, R3 and R5C corresponding to labels in FIG. 11, are shown in the timing diagram depicted by FIG. 13.

Figure 12:
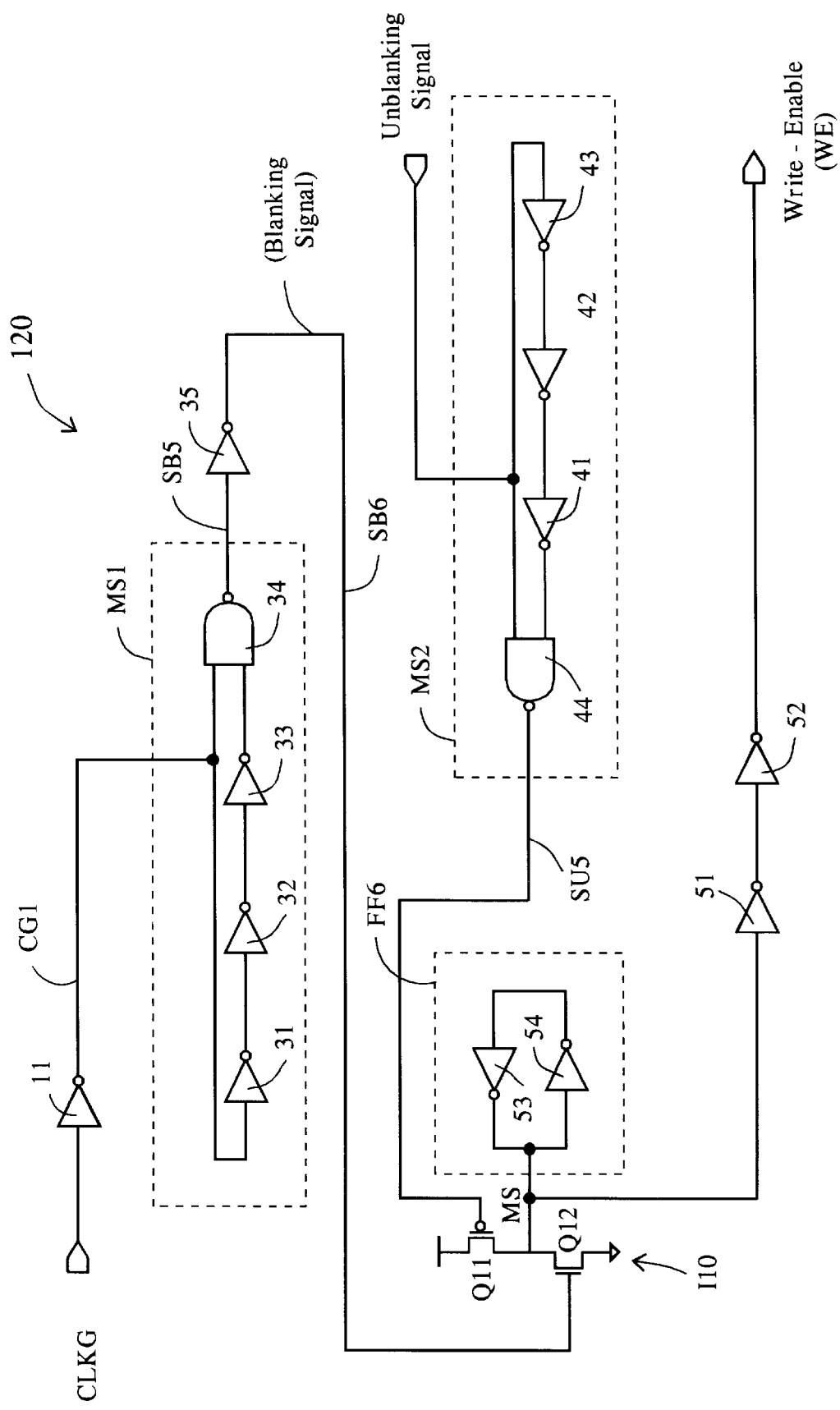
FIG. 12 is a schematic diagram of a preferred embodiment of the write-enable pulse generator of FIG. 10.

The circuit schematic diagram of a preferred embodiment of the write-enable pulse control signal generator, sub-block 120, is shown in FIG. 12. The write-enable WE generation consists of two paths. One path generates a "blanking" signal whose purpose is to block the latch array write circuits from any changes in data inputs during the read operation of the latch array. The second path generates an "unblanking" signal, which removes the write-blocking. The combination of these two functions, blanking and unblanking, forms the latch array write-enable signal, WE. The blanking signal is generated from CLKG as follows. The high-to-low transition of CLKG forms the input to inverter 11, resulting in a low-to-high transition on node CG1. This CG1 signal triggers the one-shot pulse generator MS1, consisting of a NAND gate 34 and any odd number of inverters. In the present case these are three inverters 31, 32 and 33. The two input nodes of NAND gate 34 are the CG1 signal and a delayed inversion of the CG1-signal. MS1 generates a one-shot pulse on node SB5, which goes through one more inverter 35, which creates a positive pulse on node SB6. The signal SB6 serves as the trigger for the blanking operation. Similarily, the unblanking trigger signal is generated similarly, from the unblanking input, the φRL signal, received from the clock and reset generation sub-block 110. This input triggers the one-shot pulse generator MS2. MS2 consists of a NAND gate 44 and any odd number of inverters. In the present case there are three inverters 41, 42 and 43. The two inputs of NAND gate 44 are the unblanking input and its delayed inversion. The output of the NAND 44, on node SU5, is a single-shot negative pulse (high-to-low-to-high). The node SU5 signal serves as the trigger for the unblanking operation. The blanking and unblanking trigger signals are connected to an inverter I10 with separate input signals. The signal SU5 connects to the gate of pMOS device Q11. The signal SB6 connects to the gate of nMOS device Q12. The output node MS of inverter I10 is connected to a pulse stretcher consisting of the cross-coupled inverters 53 and 54. The signal on output node MS then passes through two stages of inverter buffering to generate the write-enable control signal WE, which enables the latch array write operation. The blanking/unblanking trigger-pulses and the write-enable waveforms are shown in FIG. 13, along with the clock generation waveforms discussed above.

FIG. 13 is a timing diagram summarizing the waveforms of associated nodes in the clock-controlled circuits. A typical cycle can be partitioned into four time segments. The sequence of operations in these four time segments, as shown at the top of FIG. 13, are the present-data write, the present-data read, reset of the input- and latch-nodes, and the next-data write. A cycle is initiated by the falling edge of CLKG. In response, CG1 rises, CG2 falls, and CLKL rises, which causes launching of the latch outputs, thereby completing the data-read operation. But the leading-edge of CLKL generates its own trailing-edge via the reset-feedback path, and also generates the latch array reset controls. When CLKL rises, R3 falls, R5C falls, φRL falls, and φRI rises. The R5C signal and its inversion cause resetting of CG2 and CLKL respectively. CLKL remains low (standby-state) for the rest of the cycle. The reset signals φRL and φRI, are derived from the rising- and falling-edges of the CLKL pulse. The reset operations should be completed before the start of the next-data write operation. The next write-enabling operation and next-data write operation are dependent upon the WE signal generation. A blanking signal on node SB6 is generated from the CLKG signal. When CLKG falls it triggers an inverter and a one-shot pulse generator, thereby generating the blanking pulse. The blanking pulse pulls down the WE signal to its low-state for a relatively long period of time. An unblanking signal is generated from the rising edge of the φRL signal. It triggers another one-shot pulse generator, thereby generating the unblanking signal which causes the WE signal to be pulled-up. The WE signal rises to its high-state, whereupon the next-data write operation can proceed.

Figure 14:
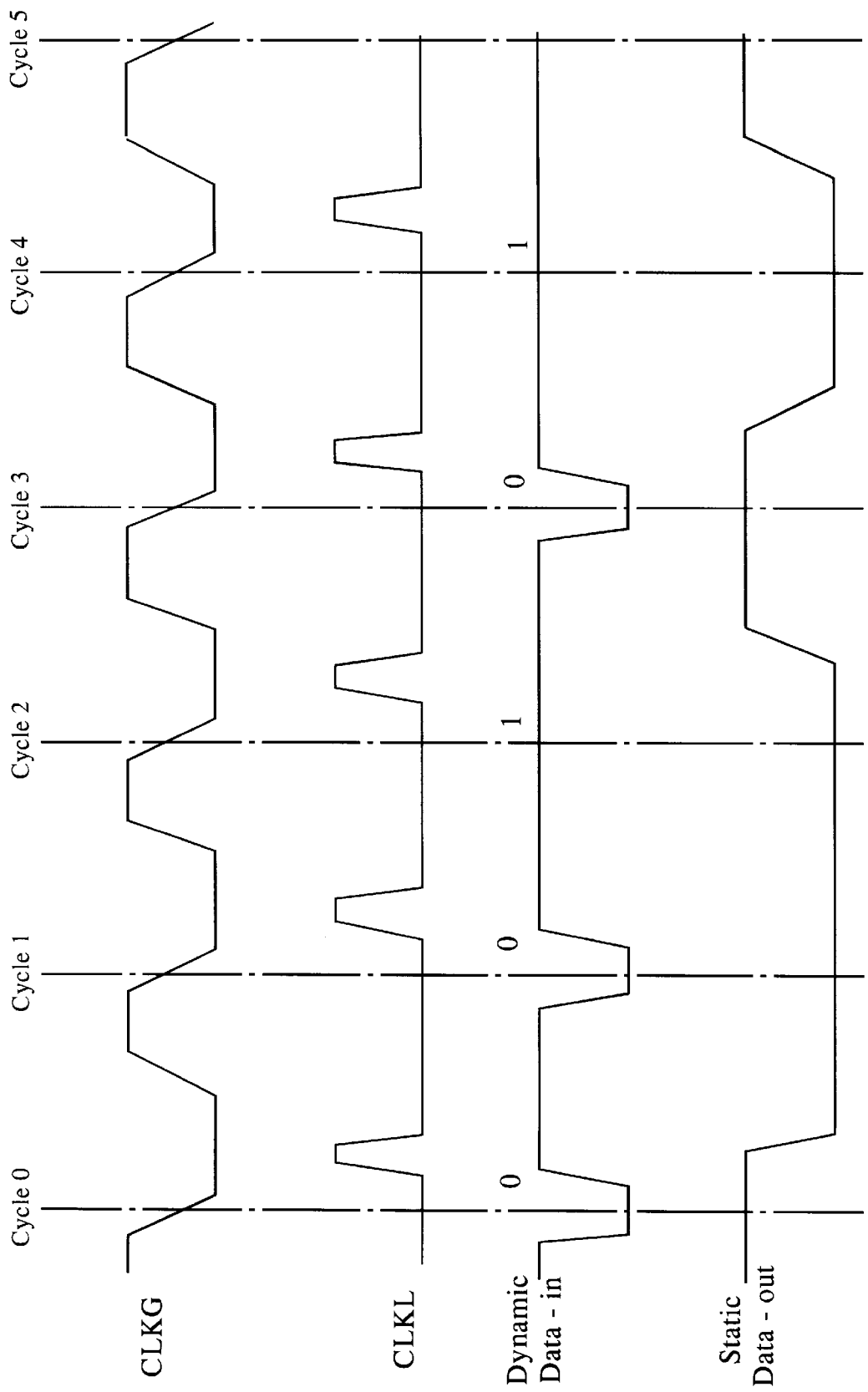
FIG. 14 is a timing diagram showing the waveforms of data-inputs and data-outputs of the pulse-to-static latch according to the present invention.

A timing diagram showing the basic datapath and clock waveforms for the pulse-to-static latches is shown by FIG. 14. This figure shows five cycles. Each falling edge of CLKG generates a CLKL pulse. The dynamic data-input pulses must remain stable for at least a setup time, determined by the time required to set the latch-nodes, before the CLKG reference clock edge. Also, there is a maximum hold time, determined by the requirement that the input pulse be gone before resetting starts. There is no minimum hold time, i.e., the input pulse can even reset before the CLKG edge, because the pulse is captured. The input data bits in this example are "00101". For this input pattern the static output has no transition between the consecutive "0"'s. In general the static outputs undergo no transitions when there is written consecutive bits of the same logical state. This fact results in a smaller switching factor, and consequently less output power dissipation then would be the case for dynamic outputs.

Figure 15:
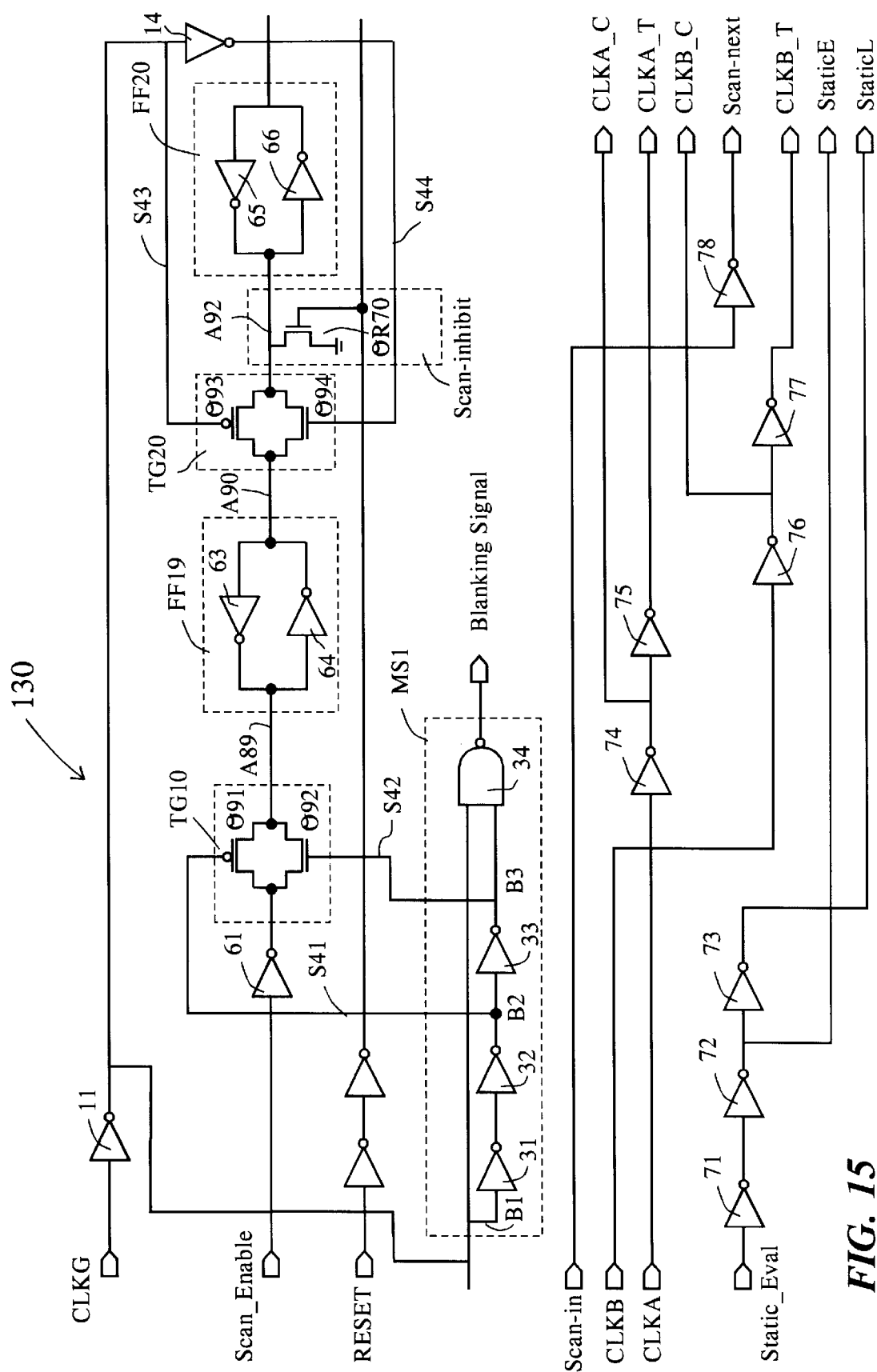
FIG. 15 is a schematic diagram of a preferred embodiment of the local buffer and test-pulse control signal generator of FIG. 10.

FIG. 15 is a schematic diagram of a preferred embodiment of the local buffer block 130 of FIG. 10, which buffers the LSSD data and controls, and the SRCMOS test-mode signals. This block basically consists of two sections, the upper portion of FIG. 15, which conditions the Scan_Enable and RESET signals, and the lower portion, which buffers and distributes the scan-in data, the scan clocks, and the static-evaluate signals. The function of the Scan_Enable signal is to prevent self-resetting of the latch-nodes during LSSD scanning. The purpose of the Scan_Enable buffering circuits, shown in the upper portion of FIG. 15, are to insure that the Scan_Enable signal utilized in the local clock and reset generation block 110 is synchronized to the global clock, CLKG. Such synchronization is desired so that single normal-operation cycles can be inserted among multiple scan cycles during LSSD testing. The scan enable path consists of an inverter, two transmission gates, two latches and one NMOS device. The scan enable signal is received by the input inverter/buffer 61. The output of buffer 61 is connected to the input of the first transmission gate TG10. The output of TG10 is connected to node A89. The gate of pMOS device Q91 is connected to node B2 and the gate of nMOS device Q92 is connected to node B3. Nodes B2 and B3 are located in the write-enable generator sub-block 120 within the MS1 circuit. The input of master latch FF19 is connected to node A89. The input of second transmission gate TG20 is connected to the node A90. The output of TG20 is connected to node A92. The gate of pMOS device Q93 is connected to node S43 and the gate of nMOS device Q94 is connected to the complement of node S43, node S44. There is also a scan-inhibit nMOS device QR70 connected to node A92. Activating the RESET signal (active-high) will turn on the nMOS device QR70, thereby pulling-down node A92, which inhibits scan operation.

The other global signals are buffered and distributed in a straight-forward fashion. The scan-in data is received and buffered by local buffer gate 78. The Static_Evaluate is received by buffer 71 and the signal further buffered by buffer/drivers 72 and 73. The output of driver 72 generates STATICE, and the output of driver 73 generates the complement, STATICL. The scan-clock-A is received by local buffer/driver 74. The output of driver 74 generates the CLKA-C signal and an inversion through driver 75 generates CLKA-T. Similarly, the scanclock-B is received by buffer/driver 76. The output of driver 76 generates the CLKB-C signal, and a further inversion through buffer 77 generates CLKB-T.

Many changes and modifications in the above-described embodiment of the invention can of course, be carried out without departing from the scope thereof. Accordingly, that scope is intended to be limited only by the scope of the appended claims.

What is claimed is:

1. A pulse-to-static conversion latch circuit for converting dynamic logic inputs to static logic outputs, comprising:

write means for capturing said dynamic logic inputs;

read means having a first node for receiving a local clock signal, a second node connected to the write means for receiving the captured dynamic logic inputs, and a third node for receiving a complement of the captured dynamic logic inputs;

means for performing level sensitive scan design (LSSD) scanning coupled to the read means and the write means; and means for converting having at least one node connected to the read means, said means for converting converts the captured dynamic logic inputs to said static logic outputs within a cycle of the local clock signal.

2. A pulse-to-static conversion latch circuit as in claim 1, wherein the write means and read means include self-resetting CMOS circuitry.

3. A pulse-to-static conversion latch circuit as in claim 1, wherein the means for performing LSSD scanning includes a scan path having a scan-in data input node for receiving a scan-in data control signal and a scan-out data output node for outputting a scan-out data control signal, said scan-out data control signal is inputted to a succeeding pulse-to-static conversion latch circuit.

4. A pulse-to-static conversion latch circuit as in claim 1, wherein a write enable signal is inputted to the write means for blocking the write means from receiving the dynamic logic inputs during a read operation of the pulse-to-static conversion latch circuit and for removing the write-blocking at the conclusion of the read operation.

5. A pulse-to-static conversion latch circuit as in claim 3, wherein the pulse-to-static conversion latch circuit is reset during LSSD scanning, the resetting of the pulse-to-static conversion latch circuit is controlled by a second clock signal received by a transistor connected to the second node of the read means connecting the write means, the read means and a first storage latch, the second clock being controlled by a scan enable signal, said scan path includes a first transmission gate connected to the scan-in data input node for receiving the scan-in data control signal and to the first storage latch for driving the first storage latch, and a second transmission gate connected to the first storage latch for receiving an output from the first storage latch and to a second storage latch for driving the second storage latch.

6. A pulse-to-static conversion latch circuit as in claim 1, wherein the read means comprises:

a steering gate connected to the second node of the read means for receiving the captured dynamic logic inputs from the write means, the steering gate having an input node for receiving the local clock signal for driving the steering gate;

a NAND gate having an output node connected to the steering gate for controlling the steering gate, the NAND gate having a first input node for receiving the local clock signal, and the NAND gate having a second input node for receiving a signal of the third node of the read means; and the means for converting further including an output latch having an input node for receiving a driving signal from the steering gate and an output node for outputting the static logic outputs.

7. A pulse-to-static conversion latch circuit as in claim 1, wherein the pulse-to-static conversion latch circuit is employed in a register file for facilitating static and dynamic dataflow in the register file.

8. The pulse-to-static conversion latch circuit as in claim 1, wherein the write means includes a latch circuit for storing the capture dynamic logic inputs; and reset means for resetting the latch circuit when said captured dynamic logic inputs have been transferred from the latch circuit to an output storage latch, said reset means being controlled by a reset input clock signal.

9. A latch bit array, comprising:

a plurality of pulse-to-static conversion latch bit cells for converting dynamic logic inputs to static logic outputs, each of said plurality of pulse-to-static conversion latch bit cells comprising:

write means for capturing said dynamic logic inputs;

read means having a first node for receiving a local clock signal, a second node connected to the write means for receiving the captured dynamic logic inputs; and means for converting having at least one node connected to the read means, said means for converting converts the captured dynamic logic inputs to said static logic outputs within a cycle of the local clock signal; and reset means for resetting the write means and read means of each of said plurality of pulse-to-static conversion latch bit cells, said reset means includes at least one node connected to each of said plurality of pulse-to-static conversion latch bit cells for transmitting at least one reset signal to each of said plurality of pulse-to-static conversion latch bit cells.

10. A latch bit array as in claim 9, wherein said plurality of pulse-to-static conversion latch bit cells are stacked together and said write means of each of said plurality of pulse-to-static conversion latch bit cells includes an input node for receiving a write enable signal for transferring the captured dynamic logic inputs to a temporary storage latch, wherein the dynamic logic inputs within the temporary storage latch within each of said plurality of pulse-to-static conversion latch bit cells are converted to said static logic outputs by said means for converting and transferred to an output latch during a second cycle of the local clock signal.

11. A latch bit array as in claim 9, wherein each of said plurality of pulse-to-static conversion latch bit cells includes means for performing level sensitive scan design (LSSD) scanning, said means for performing having a node connected to the second node of the read means.

12. A latch bit array as in claim 9, wherein the write means and read means of each of said plurality of pulse-to-static conversion latch bit cells include self-resetting CMOS circuitry.

13. A latch bit array as in claim 9, wherein each of said plurality of pulse-to-static conversion latch bit cells include means for receiving said at least one reset signal.

14. A latch bit array as in claim 9, further comprising a control circuitry connected to the latch bit array includes means for receiving a scan-enable signal for disabling said at least one reset signal during a level sensitive scan design (LSSD) scan.

15. A latch bit array as in claim 14, wherein the control circuitry includes means for generating a blanking signal which blocks the latch bit array from receiving the dynamic logic inputs when the static logic outputs are being outputted and means for generating an unblanking signal which allows the latch bit array to receive the dynamic logic inputs.

16. A latch bit array as in claim 14, wherein said means for receiving the scan-enable signal include buffering circuits for synchronizing the scan-enable signal with a system clock.

* * * * *